(12) United States Patent
Too et al.

(10) Patent No.: US 8,865,527 B2
(45) Date of Patent: Oct. 21, 2014

(54) LID ATTACH PROCESS

(71) Applicants: Seah Sun Too, Sammamish, WA (US); Maxat Touzelbaev, San Jose, CA (US); Janet Kirkland, Sonora, CA (US)

(72) Inventors: Seah Sun Too, Sammamish, WA (US); Maxat Touzelbaev, San Jose, CA (US); Janet Kirkland, Sonora, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 13/952,392

(22) Filed: Jul. 26, 2013

(65) Prior Publication Data
US 2013/0309814 A1  Nov. 21, 2013

Related U.S. Application Data

(62) Division of application No. 11/379,741, filed on Apr. 21, 2006, now Pat. No. 8,497,162.

(51) Int. Cl.
*H01L 21/00* (2006.01)
*H01L 21/50* (2006.01)
*H01L 23/10* (2006.01)
*H01L 23/42* (2006.01)
*H01L 23/00* (2006.01)

(52) U.S. Cl.
CPC ........ *H01L 21/50* (2013.01); *H01L 2224/32245* (2013.01); *H01L 2224/29109* (2013.01); *H01L 2224/92225* (2013.01); *H01L 23/10* (2013.01); *H01L 2224/83191* (2013.01); *H01L 23/42* (2013.01); *H01L 2224/83192* (2013.01); *H01L 24/32* (2013.01); *H01L 24/29* (2013.01); *H01L 2224/9205* (2013.01); *H01L 2224/83815* (2013.01); *H01L 24/16* (2013.01); *H01L 2224/16225* (2013.01); *H01L 24/73* (2013.01); *H01L 24/92* (2013.01); *H01L 2224/32225* (2013.01); *H01L 2924/16152* (2013.01); *H01L 2924/15312* (2013.01); *H01L 2924/73204* (2013.01); *H01L 2224/73253* (2013.01); *H01L 24/83* (2013.01); *H01L 2924/16251* (2013.01)
USPC ........................................................ 438/118

(58) Field of Classification Search
USPC ........................................................ 438/118
See application file for complete search history.

(56) References Cited

U.S. PATENT DOCUMENTS

| | | | |
|---|---|---|---|
| 5,658,831 A * | 8/1997 | Layton et al. .................... | 29/832 |
| 6,294,408 B1 * | 9/2001 | Edwards et al. .............. | 438/121 |
| 6,504,242 B1 * | 1/2003 | Deppisch et al. ............. | 257/707 |
| 6,617,683 B2 * | 9/2003 | Lebonheur et al. ........... | 257/707 |
| 6,748,350 B2 | 6/2004 | Rumer et al. | |
| 6,848,172 B2 | 2/2005 | Fitzgerald et al. | |
| 6,848,610 B2 | 2/2005 | Liu | |
| 6,867,978 B2 | 3/2005 | Whittenburg et al. | |
| 6,870,258 B1 | 3/2005 | Too | |
| 6,882,535 B2 | 4/2005 | Labanok et al. | |
| 6,924,170 B2 | 8/2005 | Ravi et al. | |
| 6,934,154 B2 | 8/2005 | Prasher et al. | |
| 6,936,501 B1 | 8/2005 | Too et al. | |
| 6,949,415 B2 * | 9/2005 | Alcoe et al. ................... | 438/125 |
| 6,965,171 B1 * | 11/2005 | Lee et al. ....................... | 257/783 |

(Continued)

*Primary Examiner* — Yu-Hsi D Sun
*Assistant Examiner* — Grant Withers
(74) *Attorney, Agent, or Firm* — Timothy M. Honeycutt

(57) ABSTRACT

Various methods of attaching a lid to an integrated circuit substrate are provided. In one aspect, a method of attaching a lid to a substrate that has an integrated circuit positioned thereon is provided. An adhesive is applied to the substrate and an indium film is applied to the integrated circuit. The lid is positioned on the adhesive. The adhesive is partially hardened and the indium film is reflowed. The adhesive is cured.

15 Claims, 4 Drawing Sheets

(56) References Cited

U.S. PATENT DOCUMENTS

| | | |
|---|---|---|
| 6,987,317 B2 | 1/2006 | Pike |
| 6,989,586 B2 | 1/2006 | Agraharam et al. |
| 7,009,289 B2 | 3/2006 | Hu et al. |
| 7,012,011 B2 | 3/2006 | Chrysler et al. |
| 7,014,093 B2 | 3/2006 | Houle et al. |
| 7,015,073 B2 | 3/2006 | Houle et al. |
| 7,436,058 B2 * | 10/2008 | Hua et al. .................. 257/707 |
| 7,663,227 B2 * | 2/2010 | Macris et al. ............... 257/706 |
| 7,678,615 B2 * | 3/2010 | Touzelbaev et al. .......... 438/122 |
| 7,755,184 B2 * | 7/2010 | Macris et al. ............... 257/706 |
| 8,202,765 B2 * | 6/2012 | Casey et al. ................ 438/122 |
| 8,258,016 B2 * | 9/2012 | Ito et al. .................... 438/118 |
| 2003/0209801 A1 | 11/2003 | Hua et al. |
| 2004/0262372 A1 * | 12/2004 | Houle et al. ................ 228/246 |
| 2005/0280142 A1 * | 12/2005 | Hua et al. ................... 257/707 |
| 2007/0216009 A1 * | 9/2007 | Ng ............................. 257/690 |
| 2008/0124840 A1 | 5/2008 | Su |
| 2008/0153210 A1 * | 6/2008 | Hua et al. ................... 438/122 |

\* cited by examiner

LID ATTACH PROCESS

This application is a divisional of prior application Ser. No. 11/379,741, filed Apr. 21, 2006, now U.S. Pat. No. 8,497,162.

BACKGROUND OF THE INVENTION

1. Field of the Invention

This invention relates generally to semiconductor processing, and more particularly to methods of attaching a lid to an integrated circuit package and to providing a thermal interface material therefor.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. After the die is mounted to the substrate, a lid is attached to the substrate to cover the die. Some conventional integrated circuits, such as microprocessors, generate sizeable quantities of heat that must be ferried away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. More recently, designers have begun to turn to indium as a thermal interface material.

The attachment of a lid to a die substrate involves a complex choreography of steps. The thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics.

Indium as a thermal interface material presents certain challenges. A consistent metallurgical bond between the integrated circuit and the indium, and in turn, between the indium and the package lid is desirable in order to provide a uniform thermal resistance of heat transfer pathway away from the integrated circuit and into the lid. Achieving the necessary wetting of indium is not a trivial matter. Furthermore, the aforementioned tilt of the lid may be impacted by thermally-induced movement of the lid adhesive during steps to bond the indium.

The present invention is directed to overcoming or reducing the effects of one or more of the foregoing disadvantages.

SUMMARY OF THE INVENTION

In accordance with one aspect of the present invention, a method of attaching a lid to a substrate that has an integrated circuit positioned thereon is provided. An adhesive is applied to the substrate and an indium film is applied to the integrated circuit. The lid is positioned on the adhesive. The adhesive is partially hardened and the indium film is reflowed. The adhesive is cured.

In accordance with another aspect of the present invention, a method of attaching a lid to a substrate having an integrated circuit positioned thereon is provided. An adhesive is applied to the substrate and an indium film is applied to a surface of the lid. The lid is positioned on the adhesive so that the indium film is positioned proximate the integrated circuit. The adhesive is partially hardened, and the indium film is reflowed. The adhesive is cured.

In accordance with another aspect of the present invention, a method of attaching a lid to a substrate having an integrated circuit positioned thereon is provided. An adhesive is applied to the substrate and an indium film is applied to the integrated circuit. The lid is positioned on the adhesive. The adhesive is partially hardened while a compressive force is applied to the lid. The indium film is reflowed without applying a compressive force to the lid. The adhesive is cured without applying a compressive force to the lid.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
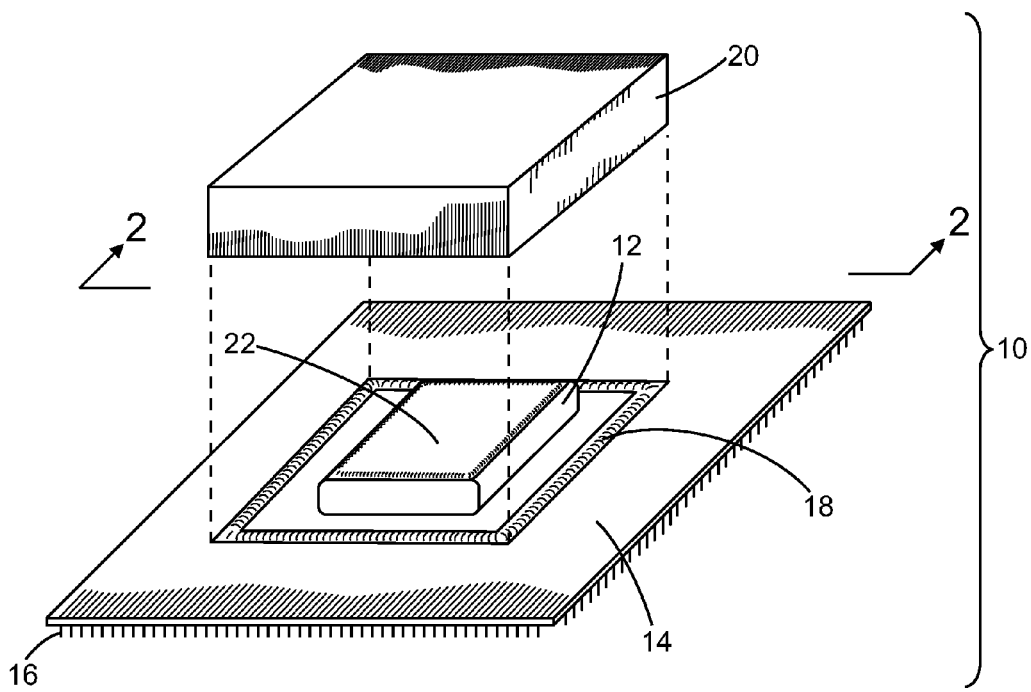
FIG. 1 is an exploded pictorial view of an exemplary embodiment of an integrated circuit package that includes an integrated circuit mounted on a substrate in accordance with the present invention.

In the drawings described below, reference numerals are generally repeated where identical elements appear in more than one figure. Turning now to the drawings, and in particular to FIG. 1, therein is shown an exploded pictorial view of an exemplary embodiment of an integrated circuit package 10 that includes an integrated circuit 12 mounted on a substrate 14. The substrate 14 may be provided with a plurality of conductor pins 16 that form a pin grid array or other pin-type arrangement for providing electrical connection to a socket or other type of electrical connection. Optionally, the substrate 14 may utilize some other form of interconnect, such as, for example, a land grid array or other types of interconnect structures. An adhesive film 18 is provided on the upper surface of the substrate 14 to secure a lid 20 to the substrate 14. The lid 20 is shown exploded from the substrate 14. To facilitate heat transfer from the integrated circuit 12 to the lid 20, a thermal interface material 22, preferably composed of indium, is disposed on the integrated circuit 12. When the lid 20 is positioned on the substrate 14 and the adhesive film 18 is fully cured as described more fully below, the indium thermal interface material 22 will establish a metallurgical bond with both the integrated circuit 12 and the overlying lid 20.

Figure 2:
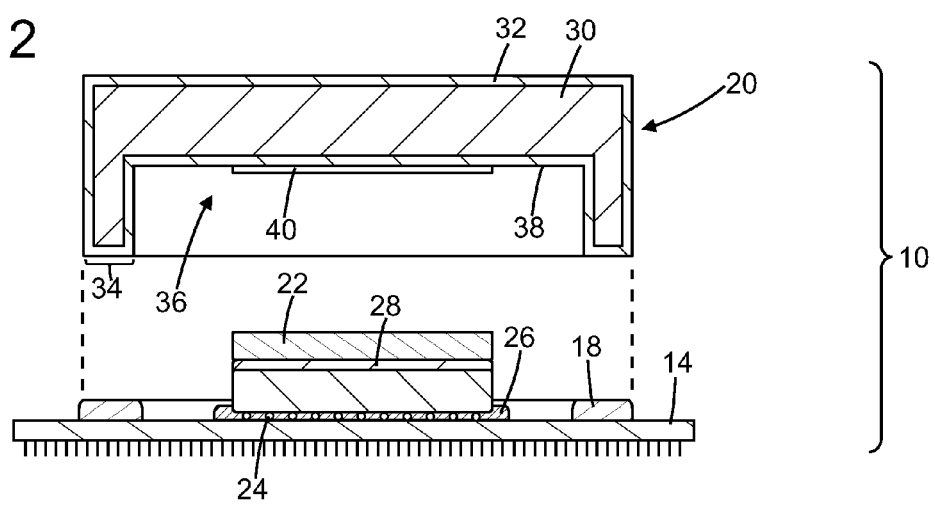
FIG. 2 is a cross-sectional view of FIG. 1 taken at 2-2 in accordance with the present invention.

Additional detail regarding the structure of the integrated circuit package 10 may be understood by referring now also to FIG. 2, which is a cross-sectional view of FIG. 1 taken at 2-2. The integrated circuit 12 may be secured to the substrate 14 in a great variety of ways. In the embodiment illustrated, the integrated circuit 12 is flip-chip mounted to the substrate 14. A plurality of solder bumps 24 are positioned between the lower surface of the integrated circuit 12 and the upper surface of the substrate 14. The bumps provide electrical interconnects between the integrated circuit 12 and a plurality of electrical conductors (not shown) positioned on the substrate 14 that are interconnected to the conductor pins 16. An underfill layer 26 is provided beneath the integrated circuit 12 to serve principally as a cushion for the integrated circuit 12 against both physical and thermal expansion loads subjected to the integrated circuit.

To facilitate the wetting of the indium thermal interface material 22 to the integrated circuit 12, the upper surface, i.e., the backside, of the integrated circuit 12 is provided with a metallization stack 28 that consists of an aluminum film formed on the integrated circuit, a titanium film formed on the aluminum film, a nickel-vanadium film formed on the titanium film and a gold film formed on the nickel-vanadium film. The aluminum film provides advantage adhesion with silicon. The titanium film provides a barrier layer to prevent gold from migrating into the integrated circuit, the nickel-vanadium film provides desirable adhesion between with gold and the gold film provides a desirable wetting surface for indium. The selection appropriate materials for the backside metallization will depend on the composition of the integrated circuit 12 and the thermal interface material 22. The stack 28 is formed on the integrated circuit 12 prior to application of the thermal interface material 22.

The lid 20 is advantageously composed of a material or materials with a relatively favorable conductive heat transfer coefficient. In an exemplary embodiment, the lid 20 consists of a copper core 30 surrounded by a nickel jacket 32. The lid 20 is generally rectangular and may be substantially square if desired. The lid 20 includes a downwardly projecting perimeter wall 34 that defines an interior space 36. The interior space 36 is sized to more than accommodate the footprint of the integrated circuit 12 and the overlying thermal interface material 22. Note that the adhesive film 18 is applied to the upper surface of the substrate 14 with a footprint that generally tracks the footprint of the perimeter wall 34 of the lid 20. To facilitate metallurgical bonding between the thermal interface material 22 composed of indium and the lower surface 38 of the lid 20, a thin film of gold 40 is positioned on the lower surface 38 of the lid 20. The various thicknesses of the thermal interface material 22, the gold film 40 as well as the vertical dimension of the interior space 36 are selected so that when the lid 20 is seated on the adhesive film 18, the thermal interface material 22 and the overlying gold film 40 will be in physical contact.

An exemplary process flow in accordance with the present invention for attaching the lid 20 to the substrate 18 will now be described in conjunction with FIGS. 1, 2 and 3. Following the mounting of the integrated circuit 12 and the fabrication of the backside metal stack 28, the adhesive film 18 is applied to the substrate 14 in step 50. One example of a suitable adhesive 18 is silicone-based thixotropic adhesive, which provides a compliant bond.

At step 60, a film of flux is applied to the integrated circuit 12. The purpose of the flux is to facilitate an ultimate metallurgical bonding between the later-applied indium thermal interface material and the backside metallization stack 28. A rosin-based flux is advantageously used as the flux material. In an exemplary embodiment, the flux may consist of about 20 to 50% by weight rosin mixed with isopropyl alcohol. A jet spray or other suitable application technique may be used to apply the flux.

At step 70, the indium thermal interface material 22 is applied to the integrated circuit 12. This may be done in at least two ways. In this illustrative embodiment, a preformed film of indium with roughly the same footprint as the integrated circuit is applied to the backside metallization 28. An alternative to be discussed below, involves securing the thermal interface material to the lid and then bringing the lid into contact with the integrated circuit 12. The preformed indium thermal interface material 22 may be supplied in a variety of forms. In an exemplary embodiment, preformed pieces of indium may be supplied on a tape that is positioned on a reel. The tape is advanced and individual preformed pieces or sheets of indium are removed from the tape and placed on the integrated circuit 12. The movement of the indium preforms may be by hand, an automated pick and place mechanism or other type of mechanism. The ultimate uniformity in terms of thickness and material distribution of the indium thermal interface material 22 is a function of the degree of tilt of the lid 20 with respect to the substrate 14. It is desirable for the degree of tilt to be as small as possible. The indium thermal interface material 22 will require a reflow process to establish the desired metallurgical bonding with the lid 20 and the integrated circuit 12. It is desired that the reflow process not adversely impact the tilt characteristics of the lid 20. Accordingly, it is preferable to perform a precure process on the adhesive 18. The goal of the precure process is to partially harden the adhesive 18 before the indium thermal interface material 22 undergoes a reflow. In this way, the reflow process will not cause substantial movement either laterally or vertically of the adhesive film and thus the overlying lid 20 during the indium reflow process.

Prior to precure, flux is applied to the indium film 22 at step 75 and the lid 20 is seated on the adhesive film 18 at step 80. A rosin-based flux of the type describe elsewhere herein may be used. The seating process may be accomplished by hand with the aid of a guide rack to be described in more detail below or by way of an automated machine. The lid 20 may be preheated prior to seating on the adhesive 18. For example, the lid 20 may be heated to about 100 to 135° C. for 5.0 to 10.0 minutes. The preheated lid 20 is next seated on the adhesive 18. It is anticipated that the temperature of the lid 20 will drop by perhaps 10.0 to 15.0° C. before being seated on the adhesive 18. At the time when the lid 20 is seated on the adhesive 18, the substrate 14 may be positioned in a fixture also to be described in more detail below and a compressive force applied to the lid 20 by way of the fixture. It should be noted that the adhesive 18 may be applied at any point prior to the seating of the lid 20.

With compressive force applied, the substrate 14 and lid combination 20 are subjected to a precure heating at step 85. Suitable temperatures and times for the precure will depend on the adhesive and the thermal interface material. Fast curing adhesives may require as little as about 2.0 minutes at 100° C., however, a precure time of up to an hour will be more typical. The precure process will fix the indium bond line thickness, that is, the thickness of thermal interface material 22.

Following the precure at step 80, an indium reflow step is performed at step 90. In an exemplary process for indium, the package 10 may be placed in a belt furnace with a nitrogen purge, and heated to about 170 to 190° C. for about 3.0 to 10.0 minutes. The reflow is advantageously performed without compressive force applied to the lid 20. Again, the goal of the indium reflow is to establish metallurgical bonding between the indium thermal interface material 22 and the overlying gold film 40 and the underlying backside metallization stack 28.

Following the indium reflow step 90, the adhesive film 18 undergoes a final curing process at step 100. The curing process is performed without compressive force applied to the lid 20. The final cure may be performed at about 125° C. for about 1.5 hours. Again the temperature and time will depend on the adhesive used.

Figure 4:
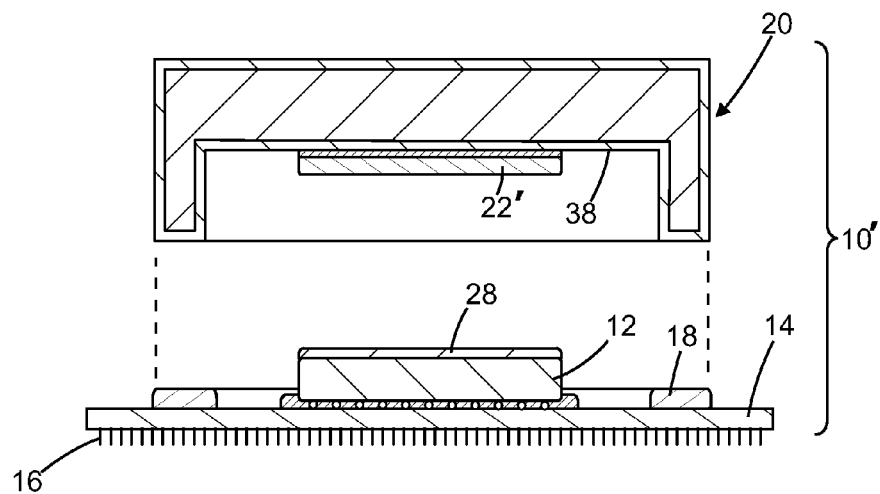
FIG. 4 is an exploded pictorial view of an alternate exemplary embodiment of an integrated circuit package that includes an integrated circuit mounted on a substrate in accordance with the present invention.
Figure 7:
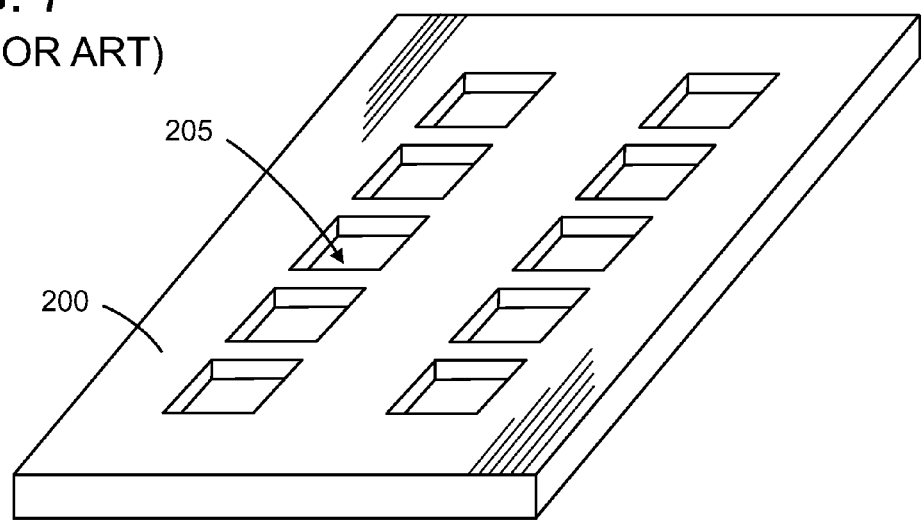
FIG. 7 is a pictorial view of an exemplary integrated circuit package lid plate to aid placement of a lid on the exemplary integrated circuit package of FIG. 1 in accordance with the present invention.

As noted above, the indium thermal interface material 22 may be first applied to the integrated circuit and the lid 20 thereafter seated on the substrate 14. However, another option also mentioned involves the preattachment of an indium thermal interface material to the lid and the subsequent attachment of the lid to the substrate. This alternate embodiment may be understood by referring now to FIG. 4, which is a cross-sectional view like FIG. 2 but of an alternate exemplary embodiment of the integrated circuit package 10'. This illustrative embodiment shares many characteristics of the embodiment depicted in FIG. 2, including the integrated circuit 12, the substrate 14, the conductor pins 16, the perimeter-like adhesive film 18 and the lid 20. The integrated circuit 12 is provided with a backside metallization stack 28. However, an indium film or foil 22' is preattached to the lid 20.

The method of applying the preattached indium thermal interface material 22' is variable. However, in an illustrative embodiment, the preattachment involves applying a flux to the underside 38 of the lid 20, placing an indium piece or foil 22' on the underside 38, performing a reflow heating step, applying a finishing flux to the reflowed indium foil 22', performing another reflow heating step, performing a cleaning step to remove excess flux, performing a stamping or "coining" of the indium foil 22' to achieve a desired thickness of the indium foil 22' and, finally, applying a layer of rosin-based flux to the coined indium foil 22'. A gold film on the underside 38 of the lid 20 is optional. With a preattached indium foil 22', the process flow described elsewhere herein in conjunction with FIG. 3, may be followed to attach the lid 20, albeit without the necessity of performing the step 70 of placing the thermal interface material on the integrated circuit separately.

Figure 3:
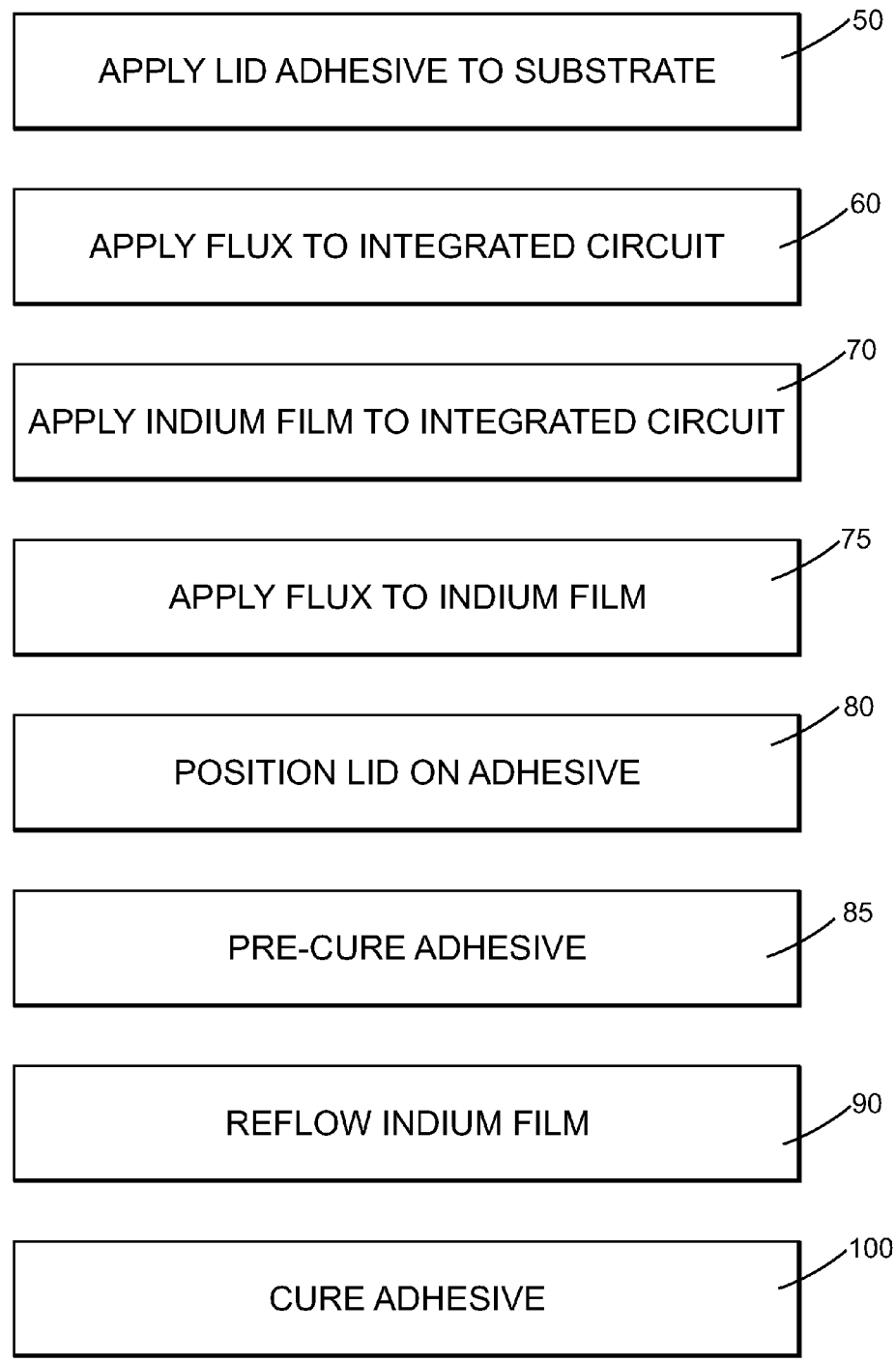
FIG. 3 is a chart of exemplary process steps for lid attachment in accordance with the present invention.
Figure 5:
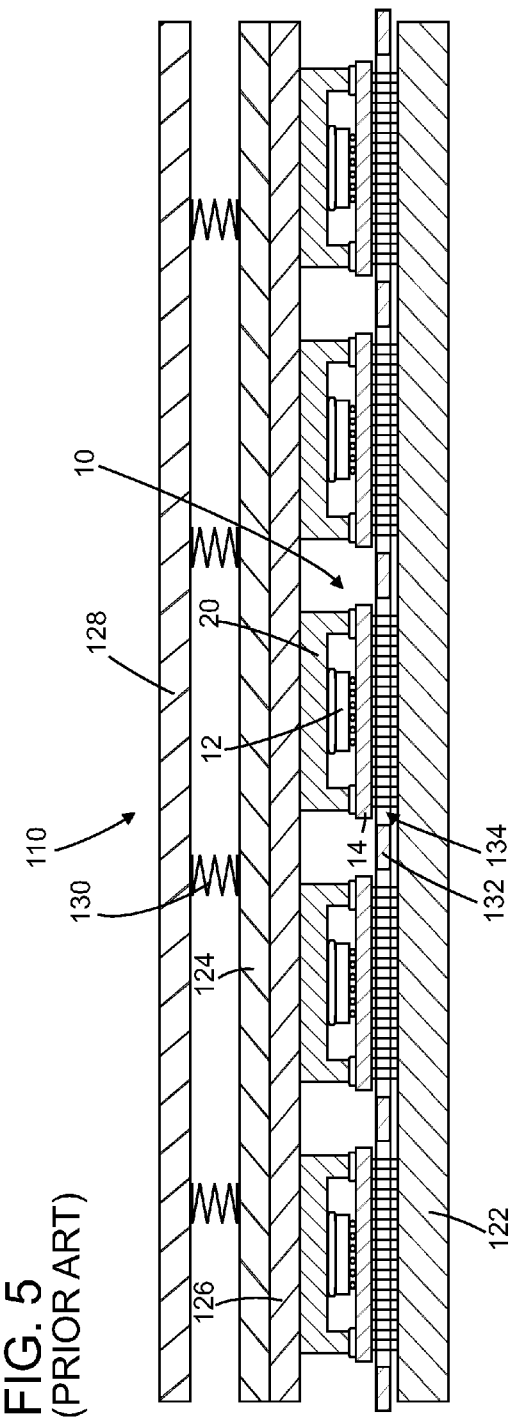
FIG. 5 is a sectional view of an exemplary package fixture to hold the exemplary integrated circuit package of FIG. 1 in accordance with the present invention.

In the process flow described elsewhere herein in conjunction with FIG. 3, it was noted that a fixture may be used to hold an integrated circuit package, such as the package 10 during various process steps. An exemplary embodiment of such a fixture 110 is depicted in FIG. 5, which is a cross-sectional view. A number of integrated circuit packages are depicted, however only one of the packages 10 is provided with element numbering. The description that follows focuses on the package 10, but is illustrative of any packages held by the fixture 110. The fixture 110 includes a base plate 122 upon which the circuit package 10 is seated. A middle plate 124 is designed to seat on top of the circuit package 10. The middle plate 124 is provided with a compliant sheet 126 composed of rubber or other compliant material. The middle plate 124 is brought into secure engagement with the upper surfaces of the circuit package 10 by way of a top plate 128 that includes a plurality of springs 130. Pressure is applied downward on the top plate 128 by an automated machine or manual clamps and results in a downward force transmitted through the middle plate 124 to the circuit package 10.

Figure 6:
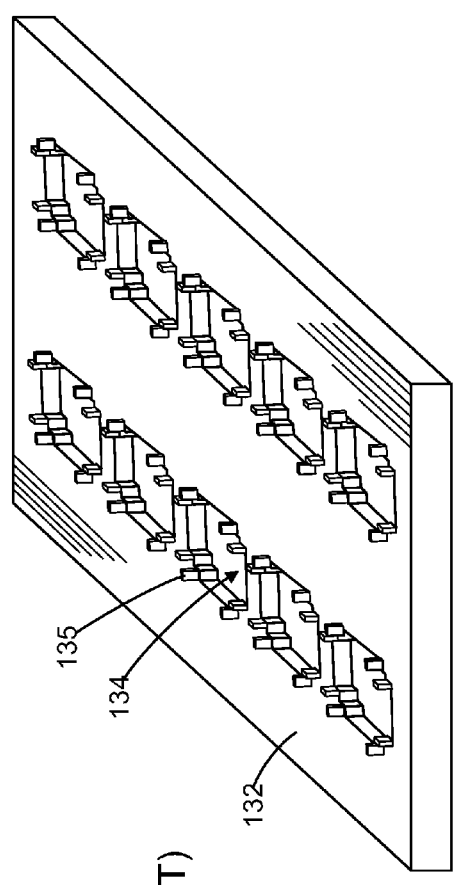
FIG. 6 is pictorial view of an exemplary integrated circuit package rack to hold the exemplary integrated circuit package of FIG. 1 in accordance with the present invention.

The assembly of the circuit package 10 involves a number of process steps that are routinely carried out in different locations. Accordingly, a rack or boat 132 is utilized to hold the circuit package 10 during movement between various processing areas. As better seen in FIG. 6, which is a pictorial view, the boat 132 includes a plurality of openings 134 and two upwardly-projecting posts 135 at each of the corners of the openings 134. The function of the posts 35 is to engage corners of the substrate 14 of the package 10 and thereby restrain yawing movements of the package 10.

An optional lid alignment plate 200 is depicted in FIG. 5. The alignment plate 200 may be used to facilitate placement of the lid 20 on the substrate 14 of the package. With the lid plate 200 temporarily placed over the package 10 and the base plate 122, the lid 20 is dropped in one of the openings 205 of the lid plate and seated on the substrate 14. The lid plate 200 may be removed prior to positioning of the middle and top plates 124 and 128 depicted in FIG. 5.

It should be understood that movement of the various pieces of the packages 10 and 10' as well as various process steps, such as lid preheating, lid placement and lid compression, may be accomplished by automated machine, by hand, or by a combination of the two. For example, a Dai-Ichi Seiko model LAS64 lid attach machine. The LAS64 is capable of high precision lid placement, lid preheating and lid compression. Of course, other types of machines may be used in this regard.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of attaching a lid to a substrate having an integrated circuit positioned thereon, comprising:
    applying an adhesive to the substrate;
    applying an indium film to the integrated circuit;
    positioning the lid on the adhesive;
    partially hardening the adhesive while applying a compressive force to the lid;
    reflowing the indium film without applying a compressive force to the lid; and
    curing the adhesive without applying a compressive force to the lid.

2. The method of claim 1, wherein the partial hardening is by heating.

3. The method of claim 1, wherein the integrated circuit has a footprint, the step of applying the indium film comprises applying a sheet of indium having a footprint substantially matching the footprint of the integrated circuit.

4. The method of claim 1, comprising heating the lid before positioning the lid on the adhesive.

5. The method of claim 1, wherein the reflowing of the indium and the curing of the adhesive comprise heating.

6. The method of claim 1, wherein the positioning of the lid on the adhesive comprises using an automated machine to pick and place the lid on the adhesive.

7. The method of claim 1, comprising reflowing the indium film in a belt furnace.

8. A method of manufacturing, comprising:
flip-chip mounting an integrated circuit to a substrate whereby a backside of the integrated circuit faces away from the substrate;
applying an adhesive to the substrate;
placing a lid on the adhesive, the lid having an underside;
positioning an indium film between the backside of the integrated circuit and the underside of the lid;
partially hardening the adhesive to fix a bond line thickness of the indium film;
reflowing the indium film after the adhesive has been partially hardened; and
curing the adhesive.

9. The method of claim 8, comprising providing the backside of the integrated circuit with a first wetting film and the underside of the lid with a second wetting film.

10. The method of claim 8, wherein the partial hardening of the adhesive is performed while compressive force is applied to the lid.

11. The method of claim 8, wherein the curing of the adhesive is performed without applying compressive force to the lid.

12. The method of claim 8, wherein the reflowing of the indium and the curing of the adhesive comprise heating.

13. The method of claim 8, comprising heating the lid before positioning the lid on the adhesive.

14. The method of claim 8, comprising reflowing the indium film in a belt furnace.

15. The method of claim 8, comprising reflowing the indium without applying compressive force on the lid.

* * * * *